United States Patent
Hirano et al.

(10) Patent No.: US 9,513,550 B2
(45) Date of Patent: Dec. 6, 2016

(54) POSITIVE RESIST COMPOSITION AND PATTERN FORMING PROCESS

(71) Applicant: SHIN-ETSU CHEMICAL CO., LTD., Tokyo (JP)

(72) Inventors: Yoshinori Hirano, Annaka (JP); Hideyoshi Yanagisawa, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 14/846,212

(22) Filed: Sep. 4, 2015

(65) Prior Publication Data
US 2015/0378259 A1 Dec. 31, 2015

Related U.S. Application Data

(63) Continuation-in-part of application No. 14/330,175, filed on Jul. 14, 2014, now Pat. No. 9,238,708.

(30) Foreign Application Priority Data

Aug. 20, 2013 (JP) ................. 2013-170436

(51) Int. Cl.
G03F 7/075 (2006.01)
G03F 7/16 (2006.01)
(Continued)

(52) U.S. Cl.
CPC ............. *G03F 7/0757* (2013.01); *C08G 61/02* (2013.01); *G03F 7/168* (2013.01); *G03F 7/20* (2013.01);
(Continued)

(58) Field of Classification Search
CPC ............... C08G 8/08; C08G 8/10; C08G 8/24; C08G 8/28; C08G 2261/144; C08G 77/38; C08G 77/42
See application file for complete search history.

(56) References Cited

U.S. PATENT DOCUMENTS 4,022,753 A 5/1977 Lohse et al.
4,877,822 A 10/1989 Itoh et al.
(Continued)

FOREIGN PATENT DOCUMENTS

JP 58-122922 A 7/1983
JP 3-97710 A 4/1991
(Continued)

Primary Examiner — Mike M Dollinger
(74) Attorney, Agent, or Firm — Westerman, Hattori, Daniels & Adrian, LLP

(57) ABSTRACT

A positive resist composition comprising an organosiloxane-modified novolak resin, a photosensitive agent, and an organic solvent is provided, the resin comprising structural units having formula (1) wherein $R^1$ is an organosiloxy group, and $R^2$ is hydrogen or alkyl. The composition is photosensitive, turns alkali soluble in the exposed region, eliminates any film thickness loss after development, and displays improved resistance to electrolytic plating and $O_2$ dry etching.

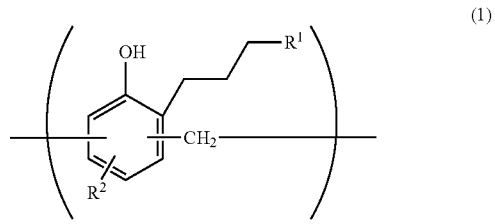

(1)

10 Claims, 2 Drawing Sheets

(51) Int. Cl.
  *G03F 7/20* (2006.01)
  *G03F 7/38* (2006.01)
  *G03F 7/32* (2006.01)
  *C08G 61/02* (2006.01)

(52) U.S. Cl.
  CPC ............... *G03F 7/322* (2013.01); *G03F 7/38* (2013.01); *C08G 2261/144* (2013.01); *C08G 2261/3424* (2013.01)

(56) References Cited

U.S. PATENT DOCUMENTS

| | | | |
|---|---|---|---|
| 4,902,732 | A | 2/1990 | Itoh et al. |
| 5,053,445 | A | 10/1991 | Itoh et al. |
| 5,173,544 | A | 12/1992 | Shimizu et al. |
| 5,206,312 | A | 4/1993 | Liao et al. |
| 5,252,687 | A | 10/1993 | Shiomi et al. |
| 5,290,882 | A | 3/1994 | Shiobara et al. |
| 5,942,369 | A | 8/1999 | Ota et al. |
| 6,429,238 | B1 | 8/2002 | Sumita et al. |
| 6,911,292 | B2 | 6/2005 | Furihata et al. |

FOREIGN PATENT DOCUMENTS

| | | |
|---|---|---|
| JP | 5-59175 A | 3/1993 |
| JP | 10-207057 A | 8/1998 |
| JP | 2004-198915 A | 7/2004 |

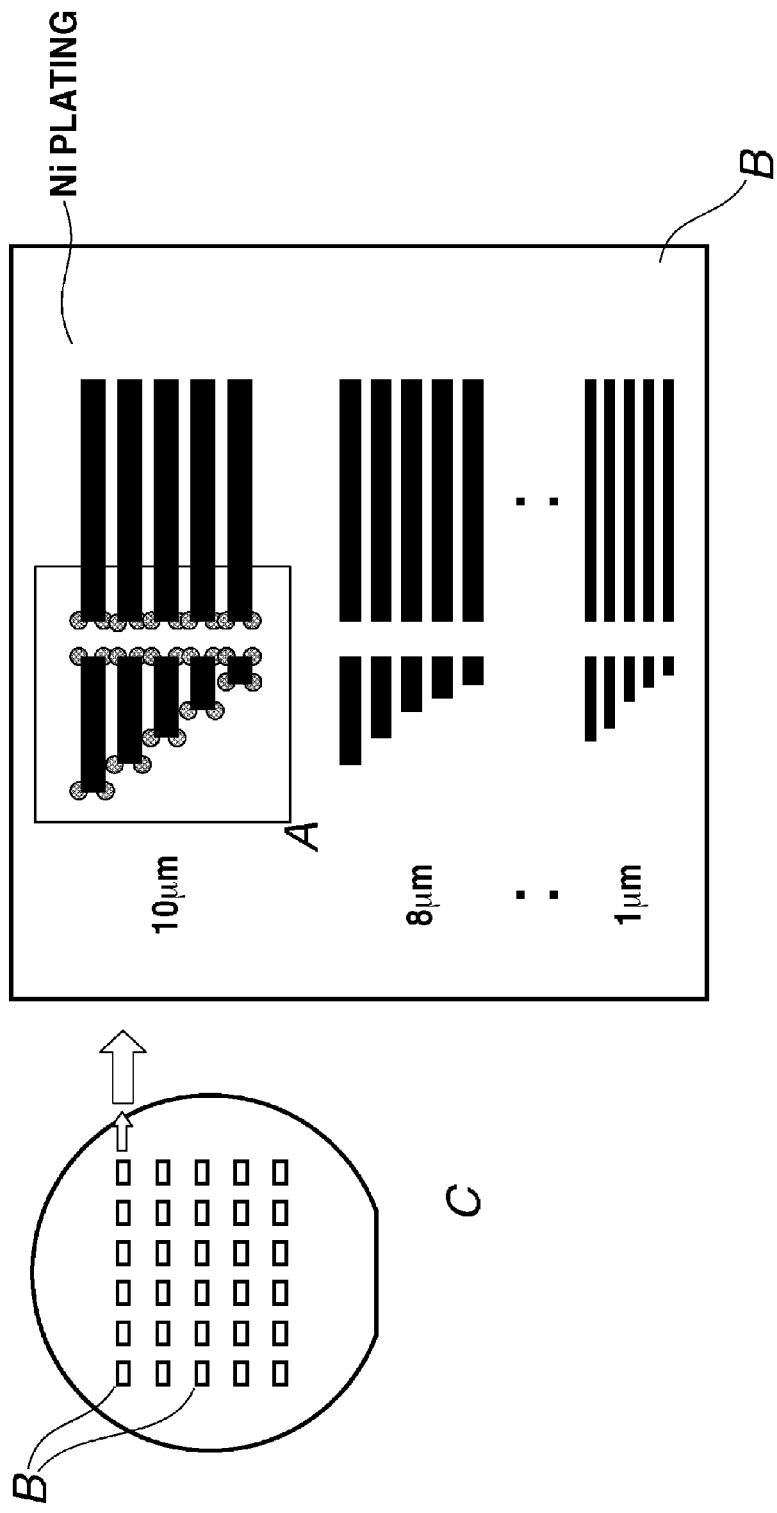

POSITIVE RESIST COMPOSITION AND PATTERN FORMING PROCESS

CROSS REFERENCE TO RELATED APPLICATION

This application is a continuation-in-part of copending application Ser. No. 14/330,175 filed on Jul. 14, 2014, the entire contents of which are hereby incorporated by reference.

TECHNICAL FIELD

This invention relates to a positive resist composition comprising an organosiloxane-modified novolak resin and a patterning process using the same.

BACKGROUND ART

A variety of silicone-modified novolak resins are known in the art. Many documents including JP-A S58-122922, for example, describe novolak resins in which phenolic hydroxyl groups are silicone modified. With these structures, the characteristics of silicone compounds are outstandingly exerted because the characteristic of phenolic hydroxyl group which is one of characteristics of novolak resins is excluded. Another class of silicone-modified novolak resins includes siloxane-modified novolak resins having a conjugated double bond as described in JP-A H03-97710. Since the siloxane modifier used in this document is an organopolysiloxane having hydrosilyl groups at both ends, intramolecular and/or intermolecular bonds are formed, posing limits to molecular motion. In addition, since the resin has a conjugated double bond and an epoxy group within a molecule, the low stress characteristic of silicone is compromised despite good mechanical properties after final curing. Also, novolak type phenolic resins which are silicone modified by block copolymerization are known from JP-A H05-59175, for example. Since they are obtained from copolymerization of telechelic novolak resin with telechelic polysiloxane, they have the drawbacks that preparation of such intermediates is cumbersome, and the alkali dissolution rate is slow because of the structure containing polysiloxane in the backbone. It would be desirable to have a novolak resin having a high alkali dissolution rate and low stress.

Since resist films of photoresist materials using prior art novolak resins will crack during or after electrolytic plating, it is desired to prevent such cracking. JP-A H10-207057 and JP-A 2004-198915 propose to add a specific additive to the photoresist material to mitigate the stress in the film for suppressing cracking. However, since the additive used in this method is a water-soluble or alkali-soluble compound, the resist film undergoes a thickness loss during long-term development. In the subsequent electrolytic plating step, this gives rise to the problems that the desired plating thickness is not reached, and the additive will be dissolved into the plating solution. These problems are inherent to the attempt to avoid structural defects of the resin itself by adding the additive. It would be desirable to have a resist material which essentially overcomes the above-mentioned drawbacks.

With respect to the silicone-modified novolak resins, U.S. Pat. No. 6,429,238 describes the modification of a novolak copolymer with a silicone. Novolak resin segments are added to both ends of the silicone. When such a silicone-modified novolak resin is used to formulate a positive resist composition, the resist composition is substantially undevelopable because the dissolution rate in alkaline aqueous solution, especially 2.38 wt % TMAH aqueous solution is significantly retarded.

CITATION LIST

Patent Document 1: JP-A S58-122922
Patent Document 2: JP-A H03-97710
Patent Document 3: JP-A H05-59175
Patent Document 4: JP-A H10-207057
Patent Document 5: JP-A 2004-198915
Patent Document 6: U.S. Pat. No. 6,429,238

DISCLOSURE OF INVENTION

An object of the invention is to provide a positive resist composition comprising an organosiloxane-modified novolak resin which turns alkali soluble, eliminates any film thickness loss during development, and exhibits improved resistance to electrolytic plating and improved etch resistance, and a pattern forming process using the same.

The inventors have found that the above and other objects are achieved by an organosiloxane-modified novolak resin which is obtained from hydrosilylation reaction between a novolak resin derived from an allyl-containing phenol and an organosiloxane having one hydrosilyl group in a molecule. Namely, a resist composition comprising the organosiloxane-modified novolak resin, a photosensitive agent, and an organic solvent forms a resist film which eliminates any film thickness loss during development, and exhibits improved resistance to plating and improved resistance to $O_2$ dry etching.

Accordingly, the invention provides a positive resist composition comprising an organosiloxane-modified novolak resin comprising structural units having the formula (1):

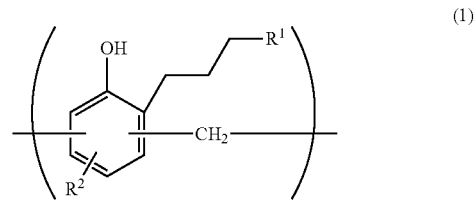

wherein $R^1$ is an organosiloxy group having a substituted or unsubstituted monovalent $C_1$-$C_{10}$ hydrocarbon group bonded to a silicon atom, and $R^2$ is hydrogen or a substituted or unsubstituted $C_1$-$C_4$ alkyl group, a photosensitive agent, and an organic solvent.

The photosensitive agent may be a quinonediazidesulfonic acid ester, and is added preferably in an amount of 5 to 45 parts by weight per 100 parts by weight of the novolak resin.

The invention also provides a positive resist composition comprising an organosiloxane-modified novolak resin comprising structural units having the formula (1):

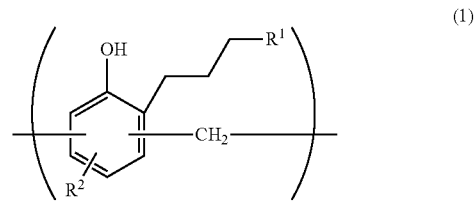

wherein $R^1$ is an organosiloxy group having a substituted or unsubstituted monovalent $C_1$-$C_{10}$ hydrocarbon group bonded to a silicon atom, and $R^2$ is hydrogen or a substituted or unsubstituted $C_1$-$C_4$ alkyl group, the hydrogen atom of some phenolic hydroxyl groups being replaced by a 1,2-naphthoquinonediazidesulfonyl group, and an organic solvent.

In this case, $R^1$ in formula (1) is preferably an organosiloxy group having the formula (5):

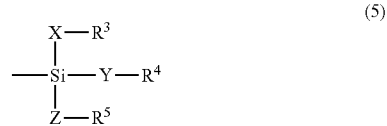

(5)

wherein $R^3$, $R^4$ and $R^5$ are each independently a substituted or unsubstituted monovalent $C_1$-$C_{10}$ hydrocarbon group, X, Y and Z are each independently a single bond or a divalent siloxane structure having the formula (6), with the proviso that at least one of X, Y and Z is a divalent siloxane structure having the formula (6),

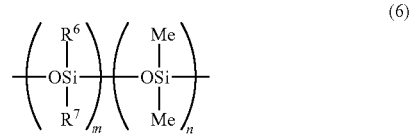

(6)

wherein $R^6$ and $R^7$ are each independently a substituted or unsubstituted monovalent $C_1$-$C_{10}$ hydrocarbon group, Me is methyl, m and n each are 0 or a positive number, m+n is an integer of at least 1.

The modified novolak resin can be obtained from hydrosilylation reaction between an allyl-containing novolak resin comprising structural units having the formula (7):

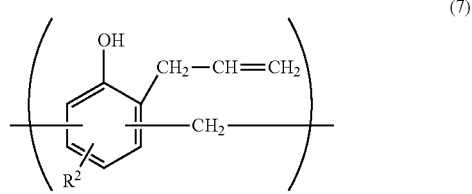

(7)

wherein $R^2$ is hydrogen or a substituted or unsubstituted $C_1$-$C_4$ alkyl group and an organosiloxane containing one hydrosilyl group in a molecule.

The invention further provides a pattern forming process comprising the steps of:
(i) coating the resist composition onto a substrate,
(ii) baking the composition to form a resist film,
(iii) exposing the film to UV radiation having a wavelength of up to 500 nm, and
(iv) optionally baking, and developing in an alkali developer.

Advantageous Effects of Invention

A polymer comprising organosiloxane-modified phenol units is used in a resist composition. A film formed of the resist composition is photosensitive, turns alkali soluble in the exposed region, eliminates any film thickness loss during development, and exhibits improved resistance to electrolytic plating and improved resistance to $O_2$ dry etching.

BRIEF DESCRIPTION OF DRAWINGS

FIG. 2 illustrates how to inspect cracks on a resist pattern.

DESCRIPTION OF PREFERRED EMBODIMENTS

Figure 1:
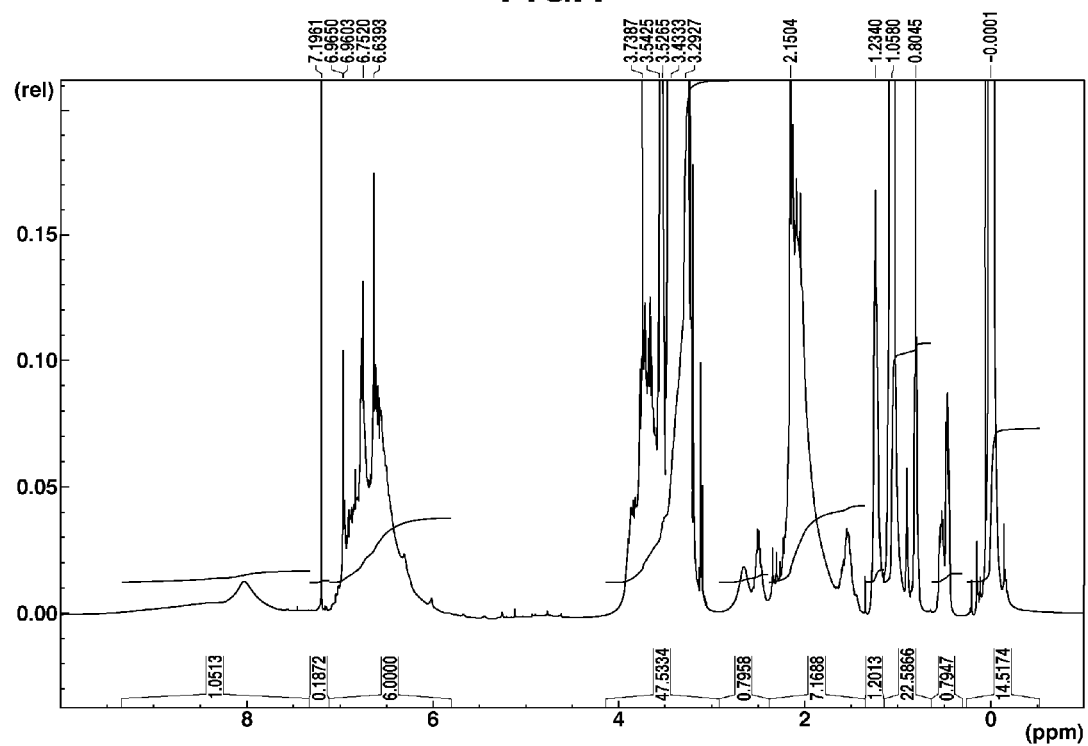
FIG. 1 is a $^1$H-NMR chart of an organopolysiloxane-modified novolak resin in Synthesis Example 1.

The notation (Cn-Cm) means a group containing from n to m carbon atoms per group.
Resist Composition The invention provides a positive resist composition comprising as base resin an organosiloxane-modified novolak resin comprising structural units having the formula (1):

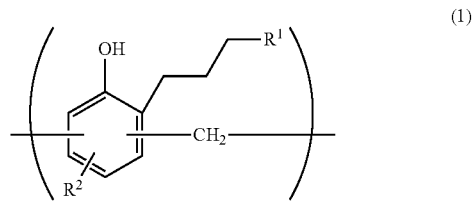

(1)

wherein $R^1$ is an organosiloxy group having a substituted or unsubstituted monovalent $C_1$-$C_{10}$ hydrocarbon group bonded to a silicon atom, and $R^2$ is hydrogen or a substituted or unsubstituted $C_1$-$C_4$ alkyl group.

The organosiloxane-modified novolak resin of formula (1) may be prepared by effecting hydrosilylation reaction between an allyl-containing novolak resin comprising structural units having the formula (7) and an organosiloxane containing one hydrosilyl group in a molecule.

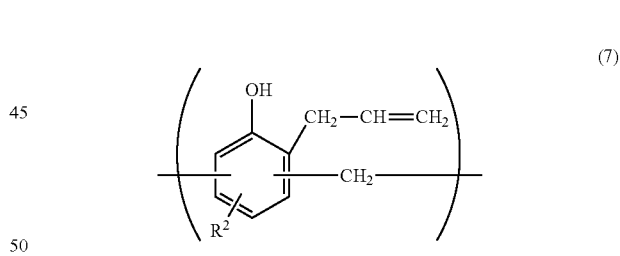

(7)

Herein $R^2$ is hydrogen or a substituted or unsubstituted $C_1$-$C_4$ alkyl group. Suitable substituted alkyl groups include fluoroalkyl groups.

The novolak resin is derived from an allyl-containing phenol as one reactant. Examples of the allyl-containing phenol include 2-allylphenol, 4-allylphenol, 6-methyl-2-allylphenol, and 4-allyl-2-methoxyphenol, with 2-allylphenol being preferred. The allyl-containing phenol preferably accounts for 1 to 40%, more preferably 2 to 25% by weight of the overall phenols of which the novolak resin is constructed.

Other phenol reactants include well-known phenols, for example, phenol, m-cresol, o-cresol, p-cresol, xylenols such as 2,3-xylenol, 2,5-xylenol, 3,5-xylenol, and 3,4-xylenol, alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and 6-tert-butyl-3-methylphenol, alkoxyphenols such as p-methoxyphenol, m-methoxyphenol, p-ethoxyphenol, m-ethoxyphenol, p-propoxyphenol, and m-propoxyphenol, isopropenylphenols such as o-isopropenylphenol, p-isopropenylphenol, 2-methyl-4-isopropenylphenol, and 2-ethyl-4-isopropenylphenol, polyhydroxyphenols such as 4,4'-dihydroxybiphenyl, bisphenol A, phenylphenol, resorcinol, hydroquinone, and pyrogallol, u-naphthol, (3-naphthol, and dihydroxynaphthalene. Of these reactants, phenol, o-cresol, m-cresol, p-cresol, 2,3-xylenol, 2,5-xylenol, and 3,5-xylenol are preferred.

The novolak resin thus obtained should preferably have a weight average molecular weight (Mw) of 2,000 to 50,000, more preferably 3,000 to 20,000, as measured versus polyhydroxystyrene standards by gel permeation chromatography (GPC).

To the allyl group as side chain on the novolak resin thus obtained, an organosiloxane (or organohydrogensiloxane) having a substituted or unsubstituted monovalent $C_1$-$C_{10}$ hydrocarbon group bonded to a silicon atom and one hydrosilyl (SiH) group in a molecule is added. The preferred organohydrogensiloxane has the formula (8).

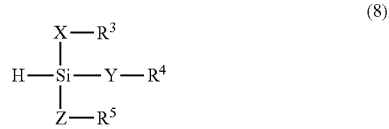

(8)

Herein $R^3$, $R^4$ and $R^5$ are each independently a substituted or unsubstituted monovalent hydrocarbon group of 1 to 10 carbon atoms, preferably 1 to 3 carbon atoms, which may be substituted with halogen or alkoxy. X, Y and Z are each independently a single bond or a divalent siloxane structure having the formula (6), with the proviso that at least one of X, Y and Z is a divalent siloxane structure having the formula (6).

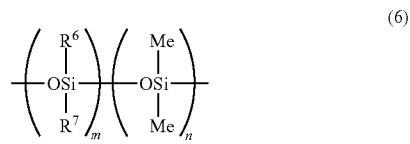

(6)

Herein $R^6$ and $R^7$ are each independently a substituted or unsubstituted monovalent hydrocarbon group of 1 to 10 carbon atoms, preferably 1 to 3 carbon atoms, which may be substituted with halogen or alkoxy. Me stands for methyl, m and n each are 0 or a positive number, m+n is an integer of at least 1.

Suitable monovalent hydrocarbon groups represented by $R^3$, $R^4$, $R^5$, $R^6$ and $R^7$ include straight, branched or cyclic alkyl groups and aryl groups such as phenyl. Suitable substituted monovalent hydrocarbon groups include fluoroalkyl groups such as trifluoromethyl.

In formula (6), m and n each are 0 or a positive number, m+n is an integer of at least 1, preferably $1 \leq m+n \leq 1,000$, and more preferably $10 \leq m+n \leq 200$.

Other organopolysiloxanes are also useful as long as they have only one hydrosilyl structure in their molecule. In the hydrosilylation reaction, the organopolysiloxane having only one hydrosilyl group in its molecule is preferably used in such amounts that F/E may fall in the range: $0.05 \leq F/E \leq 1.5$, more preferably $0.1 \leq F/E \leq 1.0$ wherein E is the equivalent amount of alkenyl group on the novolac resin and F is the equivalent amount of hydrosilyl group. If F/E<0.05, sufficient flexibility may not be obtained. If F/E>1.5, an excess of siloxane may be left unreacted, leading to a lowering of storage stability.

The addition (or hydrosilylation) reaction between the allyl-containing novolak resin and the organohydrogenpolysiloxane of formula (8) may be conducted in an organic solvent. The organic solvent used herein is not particularly limited as long as both the components dissolve therein to form a uniform solution. Suitable organic solvents include aromatic hydrocarbons such as benzene, toluene and xylene, ethers such as diethyl ether, dibutyl ether, tetrahydrofuran, cyclopentyl methyl ether, and dioxane, ketones such as methyl isobutyl ketone, methyl propyl ketone and methyl pentyl ketone, and alcohols such as ethanol and isopropyl alcohol, which may be used alone or in admixture. The solvent is used in an amount of 1 to 500 parts, preferably 2 to 200 parts by weight per 100 parts by weight of the starting novolak resin.

To the uniform solution of both the components, any of well-known addition catalysts may be added, for example, organic peroxides, tertiary amines, phosphines, and compounds of transition metals such as platinum, palladium and rhodium. Of these, platinum based catalysts such as chloroplatinic acid are preferred. The catalyst may be added in a catalytic amount, typically in the case of platinum based catalysts, in an amount of 1 to 10,000 ppm based on the organosiloxane. In some cases, the catalyst may be replaced by UV irradiation.

Once the catalyst is added, the system is kept at a reaction temperature of 40 to 140° C., preferably 60 to 120° C. for 0.5 to 20 hours, preferably 1 to 10 hours, whereby the allyl group on side chain of the novolak resin is partially modified with the organopolysiloxane, yielding a novolak resin having structural units of the following formula (1).

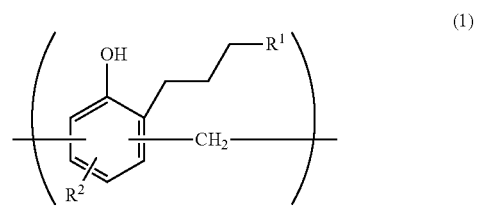

(1)

Herein $R^1$ is an organosiloxy group having a substituted or unsubstituted monovalent $C_1$-$C_{10}$ hydrocarbon group bonded to a silicon atom, preferably an organosiloxy group of the following formula (5), and $R^2$ is hydrogen or a substituted or unsubstituted $C_1$-$C_4$ alkyl group.

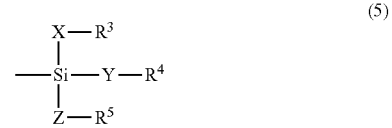

(5)

Herein $R^3$, $R^4$ and $R^5$ are each independently a substituted or unsubstituted monovalent $C_1$-$C_{10}$ hydrocarbon group, X, Y and Z are each independently a single bond or a divalent siloxane structure having the formula (6), with the proviso that at least one of X, Y and Z is a divalent siloxane structure having the formula (6).

The resist composition of the invention is defined as comprising the organosiloxane-modified novolak resin comprising structural units of formula (1), a photosensitive agent, and an organic solvent.

The photosensitive agent used herein is preferably a quinonediazidesulfonic acid ester compound. Examples include naphthoquinonediazidesulfonic acid ester of 2,3,4-trihydroxybenzophenone, naphthoquinonediazidesulfonic acid ester of 2,3,4,4'-tetrahydroxybenzophenone, naphthoquinonediazidesulfonic acid ester of 2,2',4,4'-tetrahydroxybenzophenone, compounds of the following formulae (H-1) to (H-3), and a compound selected from trihydroxybenzophenone and tetrahydroxybenzophenone in which the hydrogen atom of one or more hydroxyl groups is replaced by a naphthoquinonediazidesulfonyl group. Preferred are trisphenol compounds substituted with a naphthoquinonediazidesulfonyl group.

In a preferred embodiment, 5 to 45 parts by weight of the photosensitive agent is present per 100 parts by weight of the novolak resin. More preferably the amount of the photosensitive agent is 15 to 30 parts by weight. Outside the range, a less amount of the photosensitive agent tends to reduce resolution, film retention and exposure margin whereas a more amount tends to invite a sensitivity lowering and leave residues after development.

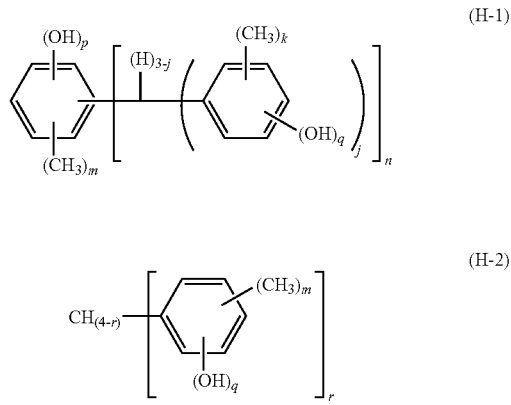
(H-1)

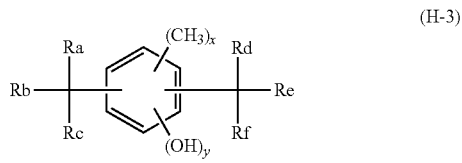
(H-2)

Herein j is 1 or 2, k, m and p each are an integer of 0 to 3, n is an integer of 1 to 4, q is an integer of 1 to 3, r is 2 or 3, m+p+n≤6 and k+q≤5.

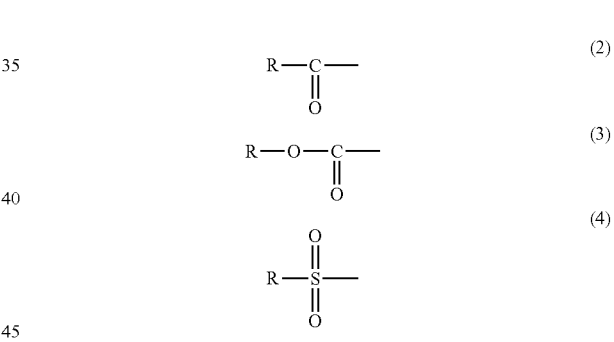
(H-3)

Herein Ra, Rb, Rc, Rd, Re, and Rf are each independently hydrogen, methyl or a group of the following formula (H-4), at least one of Ra, Rb and Rc, and at least one of Rd, Re and Rf have a structure of benzene ring having hydroxyl added thereto, x and y each are an integer of 0 to 3.

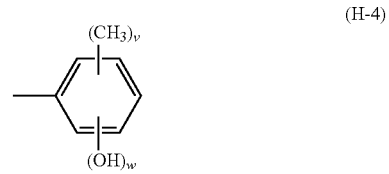
(H-4)

Herein v and w each are an integer of 0 to 3.

Also, a novolak resin of formula (1) wherein the hydrogen atom of some phenolic hydroxyl groups is replaced by a 1,2-naphthoquinonediazidesulfonyl group may be used as the photosensitive agent.

It is noted that the percent substitution of 1,2-naphthoquinonediazidesulfonyl halide is 0.02 to 0.70 mole, preferably 0.04 to 0.50 mole per hydrogen atom of phenolic hydroxyl groups in the novolak resin. Also, the percent substitution of substituted carbonyl or sulfonyl group is 0 to 1 mole, preferably 0.01 to 0.80 mole per hydrogen atom of phenolic hydroxyl groups in the novolak resin. If these percent substitutions are higher than the ranges, undesirably a hydrophobic effect may be exerted, and the development rate significantly retarded. If the percent substitutions are lower, undesirably even the unexposed region may be dissolved in the developer. If necessary, the hydrogen atom of some of the remaining hydroxyl groups may be replaced by a functional group of at least one type selected from monovalent functional groups of the following general formulae (2), (3) and (4), preferably in a proportion of 0.01 to 0.80 mole per hydrogen atom.

$$R-\underset{\underset{O}{\|}}{C}-$$ (2)

$$R-O-\underset{\underset{O}{\|}}{C}-$$ (3)

$$R-\underset{\underset{O}{\|}}{\overset{\overset{O}{\|}}{S}}-$$ (4)

Herein R is $C_1$-$C_{30}$ alkyl, $C_6$-$C_{20}$ aryl, or $C_7$-$C_{20}$ aralkyl.

The means of substituting 1,2-naphthoquinonediazidesulfonyl for the hydrogen atom of some hydroxyl groups on the organosiloxane-modified novolak resin of formula (1) may be conventional partial esterification, which may be implemented by the following method, for example.

In one exemplary method, the organosiloxane-modified novolak resin prepared as previously described is dissolved in a solvent. Examples of the solvent include 1,4-dioxane, tetrahydrofuran, cyclopentyl methyl ether, acetone, methyl ethyl ketone, N,N-dimethylformamide, N,N-dimethylacetamide, and toluene, which may be used alone or in admixture.

Then one or both of 1,2-naphthoquinonediazide-4-sulfonyl halide and 1,2-naphthoquinonediazide-5-sulfonyl halide (wherein the halogen is preferably chlorine, bromine or iodine) are dissolved in the solution. If necessary, at least one of halides having the general formulae (9), (10) and (11) may also be dissolved in the solution. The solution is then held at 5 to 50° C. for 0.2 to 10 hours in the presence of a basic catalyst for reaction to take place.

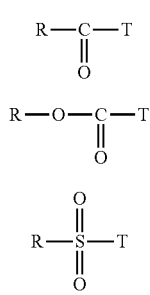

$$R-C-T \quad (9)$$
$$\parallel$$
$$O$$

$$R-O-C-T \quad (10)$$
$$\parallel$$
$$O$$

$$R-S-T \quad (11)$$
$$\parallel\parallel$$
$$O$$

(with O above S as well)

wherein R is $C_1$-$C_{30}$ alkyl group, $C_6$-$C_{20}$ aryl group or $C_7$-$C_{20}$ aralkyl group, and T is a halogen atom selected from chlorine, bromine, or iodine.

Examples of the organic solvent used in the resist composition include, but are not limited to, butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, dipropylene glycol monomethyl ether, dipropylene glycol dimethyl ether, dipropylene glycol monomethyl ether, dipropylene glycol monopropyl ether, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol methyl ether acetate (PGMEA), propylene glycol ethyl ether acetate, propylene glycol propyl ether acetate, methyl lactate, ethyl lactate, propyl lactate, and tetramethylene sulfone. Inter alia, dipropylene glycol alkyl ethers and alkyl lactates are preferred. The solvents may be used alone or in admixture. An appropriate amount of the solvent added is 20 to 2,000 parts, more preferably 40 to 200 parts by weight per 100 parts by weight of the novolak resin.

A surfactant may be added to the resist composition to facilitate coating operation. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (DIC Corp.), Fluorad FC-430 and FC-431 (Sumitomo 3M Co., Ltd.), Surfynol E1004 (Nissin Chemical Industry Co., Ltd.), Asahiguard AG710, Surflon S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). These surfactants may be used alone or in admixture. In the resist composition, the surfactant is formulated in an amount of at least 0.0001 part, preferably at least 0.001 part and up to 3 parts, preferably up to 1 part by weight per 100 parts by weight of the base resin.

If desired, crosslinking agents, dyes, dissolution accelerators, adhesion improvers, stabilizers and other known additives may be added to the resist composition.

Process

When the resist composition is used in the fabrication of various semiconductor devices, any well-known lithography methods may be employed. The pattern forming process of the invention is defined as comprising the steps of coating the resist composition onto a substrate, baking the composition to form a resist film, exposing the film to radiation or electron beam through a photomask, optionally baking, and developing the film in a developer to form a resist pattern.

The resist composition is applied onto a substrate of Si, $SiO_2$, SiN, SiON, TiN, WSi, BPSG or SOG, a metal substrate of Au, Ti, W, Cu, Ni—Fe, Ta, Zn, Co or Pb, or another substrate such as organic antireflective coating, by a suitable technique such as spin coating, roll coating, flow coating, dip coating, spray coating or doctor blade coating. The coating is prebaked by heating means, typically a hot plate at 60 to 150° C. for 1 to 10 minutes, preferably 80 to 120° C. for 1 to 5 minutes to form a resist film having a thickness of 0.1 to 100 μm, preferably 1.0 to 50 The resist film is then exposed to radiation such as UV, deep UV, X-ray, excimer laser, γ-ray or synchrotron radiation, or electron beam (EB), preferably radiation with a wavelength of up to 500 nm, especially UV of 350 to 450 nm, through a photomask having the desired pattern. The exposure dose is preferably 10 to 5,000 mJ/$cm^2$, more preferably 100 to 4,000 mJ/$cm^2$. If desired, the resist film is baked (PEB) on a hot plate at 60 to 150° C. for 1 to 10 minutes, preferably 80 to 120° C. for 1 to 5 minutes. The exposed resist film is then developed in a developer by a standard technique such as dip, puddle or spray development. A typical developer is an alkaline aqueous solution, specifically a 0.1 to 5 wt %, more specifically 2 to 3 wt % aqueous solution of tetramethylammonium hydroxide (TMAH) or the like. In this way, the desired fine-size resist pattern is formed on the substrate.

Next, a plating pattern may be formed on the resist pattern-bearing substrate. While the resist pattern formed by the above patterning process serves as a mask, electrolytic plating or electroless plating may be carried out in a standard way to deposit a conductor pattern on the substrate. The resist pattern is then removed. The substrate used in this embodiment should include at least a surface layer formed of a metal. For example, a silicon substrate having a coating of copper deposited by sputtering or other deposition techniques may be used. Suitable electrolytic plating and electroless plating methods include electrolytic Cu plating, electroless Cu plating, electrolytic Fe—Ni plating and electrolytic Au plating, which may be performed in any well-known baths and under standard conditions. The thickness of plating is generally 80 to 100% of the thickness of the resist pattern. For example, a resist pattern of 10 μm thick is formed on a seed layer of copper, after which electrolytic copper plating is perform to form a copper pattern of 8 to 10 μm thick. It is noted that where a semiconductor device is manufactured, the semiconductor substrate is etched through the resist pattern serving as a mask, after which the resist pattern is removed.

EXAMPLES

Synthesis Examples, Examples and Comparative Examples are given below by way of illustration and not by way of limitation.

Synthesis Example 1

A 1-L four neck flask equipped with a condenser and stirrer was charged with 50 g of a novolak resin composed of m-cresol/p-cresol/2-allylphenol in a weight ratio of 36/54/10 and having a Mw of 4,500 and 150 g of cyclopentyl methyl ether. Further 34 g of a SiH-containing polysiloxane having the following formula (12) was added to the flask, which was heated at 60° C., and 0.08 g of a 0.5 wt % isopropyl alcohol solution of chloroplatinic acid was added.

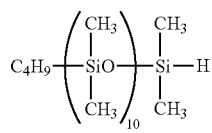
(12)

The flask was then heated at 90° C. for 4 hours for reaction. The solvent was stripped off, recovering the solid matter. The resin thus obtained had a Mw of 7,200 as measured by GPC. The resin was analyzed by $^1$H-NMR spectroscopy, confirming that the desired organopolysiloxane-modified novolak resin had been synthesized. FIG. 1 is the $^1$H-NMR chart of the resin.

Synthesis Example 2

A 1-L four neck flask equipped with a condenser and stirrer was charged with 50 g of the novolak resin (Synthesis Example 1) and 1,500 g of cyclopentyl methyl ether. Further 195 g of a SiH-containing polysiloxane having the following formula (13) was added to the flask, which was heated at 60° C., and 0.40 g of a 0.5 wt % isopropyl alcohol solution of chloroplatinic acid was added.

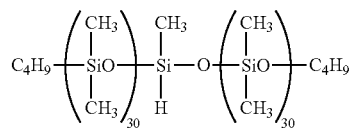
(13)

The flask was then heated at 90° C. for 4 hours for reaction. The solvent was stripped off, recovering the solid matter. The resin thus obtained had a Mw of 9,300. The resin was analyzed by $^1$H-NMR spectroscopy as in Synthesis Example 1, confirming that the desired organopolysiloxane-modified novolak resin had been synthesized.

Synthesis Example 3

A 1-L four neck flask equipped with a condenser and stirrer was charged with 50 g of the novolak resin (Synthesis Example 1) and 150 g of cyclopentyl methyl ether. Further 25 g of a SiH-containing polysiloxane having the following formula (14) was added to the flask, which was heated at 60° C., and 0.08 g of a 0.5 wt % isopropyl alcohol solution of chloroplatinic acid was added.

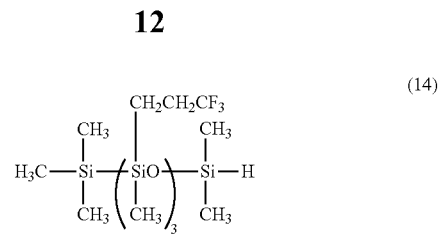
(14)

The flask was then heated at 90° C. for 4 hours for reaction. The solvent was stripped off, recovering the solid matter. The resin thus obtained had a Mw of 6,700. The resin was analyzed by $^1$H-NMR spectroscopy, confirming that the desired organopolysiloxane-modified novolak resin had been synthesized.

Synthesis Example 4

A 1-L four neck flask equipped with a condenser and stirrer was charged with 50 g of the novolak resin (Synthesis Example 1) and 150 g of cyclopentyl methyl ether. Further 9.0 g of a SiH-containing polysiloxane having the following formula (15) was added to the flask, which was heated at 60° C., and 0.08 g of a 0.5 wt % isopropyl alcohol solution of chloroplatinic acid was added.

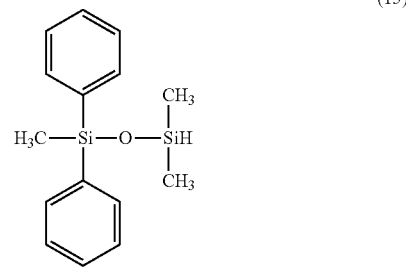
(15)

The flask was then heated at 90° C. for 4 hours for reaction. The solvent was stripped off, recovering the solid matter. The resin thus obtained had a Mw of 5,300. The resin was analyzed by $^1$H-NMR spectroscopy, confirming that the desired organopolysiloxane-modified novolak resin had been synthesized.

Synthesis Example 5

A 1-L four neck flask equipped with a condenser and stirrer was charged with 50 g of the novolak resin (Synthesis Example 1) and 150 g of cyclopentyl methyl ether. Further 54 g of a SiH-containing polysiloxane having the following formula (16) was added to the flask, which was heated at 60° C., and 0.08 g of a 0.5 wt % isopropyl alcohol solution of chloroplatinic acid was added.

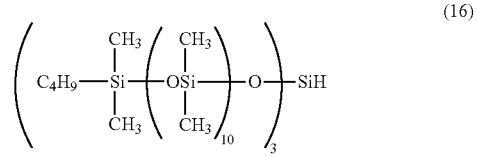
(16)

The flask was then heated at 90° C. for 4 hours for reaction. The solvent was stripped off, recovering the solid matter. The resin thus obtained had a Mw of 9,400. The resin was analyzed by $^1$H-NMR spectroscopy, confirming that the desired organopolysiloxane-modified novolak resin had been synthesized.

Comparative Synthesis Example 1

A 1-L four neck flask equipped with a condenser and stirrer was charged with 50 g of the novolak resin (Synthesis Example 1) and 1,500 g of cyclopentyl methyl ether. Further 300 g of a SiH-containing polysiloxane having the following formula (17) was added to the flask, which was heated at 60° C., and 0.60 g of a 0.5 wt % isopropyl alcohol solution of chloroplatinic acid was added.

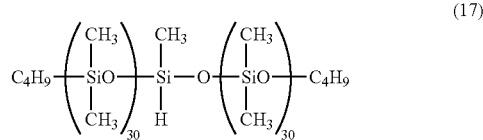
(17)

The flask was then heated at 90° C. for 4 hours for reaction. The solution was added dropwise to toluene, and the excess of the polysiloxane of formula (17) was removed. The solvent was stripped off, recovering the solid matter. The resin thus obtained had a Mw of 9,500.

Examples 1 to 5 and Comparative Example 1

A resist solution was prepared by dissolving 100 parts by weight of each of the resins obtained in Synthesis Examples 1 to 5 and Comparative Synthesis Example 1, 20 parts by weight of naphthoquinonediazidesulfonic acid ester photosensitive agent (NT-300P by Toyo Gosei Co., Ltd.), and 0.1 part by weight of surfactant X-70-093 (Shin-Etsu Chemical Co., Ltd.) in 300 parts by weight of a 3/7 solvent mixture of PGMEA and cyclopentanone, and passing through a membrane filter with a pore size of 1 μm. Using a spin coater, the filtrate was coated onto a silicon substrate at such a spin rate as to provide a coating thickness of 5 μm. The coating was prebaked at 100° C. for 120 seconds before it was exposed in a varying dose by an i-line stepper (NSR-2205i11D by Nikon Corp.). Using a developer of 2.38% TMAH, development of 50 seconds and 6 times was carried out to form a line-and-space pattern. The pattern was observed under a scanning electron microscope, from which the dose at which the line width and the space width became identical in a 10 μm line-and-space iterative pattern was determined as sensitivity. The results are shown in Table 1.

Comparative Example 2

The procedure of Example 1 was repeated aside from using a commercially available novolak resin EPR5030G (Asahi Organic Chemicals Industry Co., Ltd.). The results are shown in Table 1.

To demonstrate the resistance of a resist pattern to electrolytic plating, nickel plating was performed on the substrate, which was observed whether or not cracks occurred. By operating a dry etching system (DEM-451 by Nichiden Anelva Co., Ltd.) at 100 W for 30 seconds, the resist pattern and substrate surface were subjected to ashing by oxygen plasma. Then the substrate was immersed in a nickel plating bath (Microfab Ni200 by Electroplating Engineers of Japan Ltd.), across which a constant current was conducted at 55° C. for 10 minutes for nickel plating, depositing a Ni film of about 3 μm thick. Finally, the surface was cleaned with flowing pure water. The resist surface was observed under an optical microscope to see whether or not the resist pattern was deformed and cracked by the growth stress of plating. With respect to crack resistance, corner portions on the resist pattern which are susceptible to cracking as shown in FIG. 2 were observed at 900 points, and cracked points were counted. A sample is judged fully crack resistant when the crack count is less than 20 points among 900 points. In FIG. 2, section A designates an area of crack inspection, one shot of 10 μm line-and-space pattern includes 6×5=30 points, and the overall wafer surface includes 30 shots, that is, 30×30=900 points.

TABLE 1

| | Sensitivity (mJ/cm$^2$) | Pattern profile | Crack resistance |
|---|---|---|---|
| Example 1 | 500 | rectangular | good |
| Example 2 | 600 | rectangular | good |
| Example 3 | 450 | rectangular | good |
| Example 4 | 400 | rectangular | good |
| Example 5 | 650 | rectangular | good |
| Comparative Example 1 | — | — | not resolved, not tested |
| Comparative Example 2 | 450 | rectangular | NG (200) |

Example 6

In 200 g of a 1/1 mixture of acetone and cyclopentyl methyl ether, 100 g of the organosiloxane-modified novolak resin of Synthesis Example 1 was dissolved, then 5.38 g of 1,2-naphthoquinonediazide-5-sulfonyl chloride (NQD5) was dissolved, and 2.0 g of triethylamine was added dropwise such that the internal temperature might not exceed 40° C. The solution was aged for 1 hour, before it was poured into 2,000 ml of 0.1N hydrochloric acid aqueous solution for precipitation. After collection, the precipitate was dissolved in 300 ml of methyl isobutyl ketone again. On vacuum stripping at 40° C., the solid matter was recovered.

To the solids, 1,000 ppm of surfactant X-70-093 (Shin-Etsu Chemical Co., Ltd.) and a solvent mixture of dipropylene glycol dimethyl ether and ethyl lactate in a weight ratio of 7/3 were added so as to give a solid concentration of 70 wt %. After the liquid became uniform, it was passed through a glass filter with a pore size of 1 μm. Otherwise the same procedure as in Example 1 was followed. The results are shown in Table 2.

TABLE 2

| | Sensitivity (mJ/cm$^2$) | Pattern profile | Crack resistance |
|---|---|---|---|
| Example 6 | 1,000 | rectangular | good |

Japanese Patent Application No. 2013-170436 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising an organosiloxane-modified novolak resin comprising structural units having the formula (1):

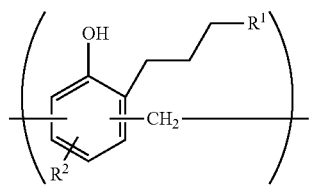

wherein $R^1$ is an organosiloxy group having a substituted or unsubstituted monovalent $C_1$-$C_{10}$ hydrocarbon group bonded to a silicon atom, and $R^2$ is hydrogen or a substituted or unsubstituted $C_1$-$C_4$ alkyl group, a photosensitive agent, and an organic solvent.

2. The resist composition of claim 1 wherein the photosensitive agent is a quinonediazidesulfonic acid ester.

3. The resist composition of claim 1 wherein 5 to 45 parts by weight of the photosensitive agent is present per 100 parts by weight of the novolak resin.

4. The resist composition of claim 1 wherein $R^1$ in formula (1) is an organosiloxy group having the formula (5):

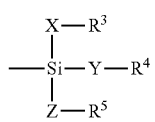

wherein $R^3$, $R^4$ and $R^5$ are each independently a substituted or unsubstituted monovalent $C_1$-$C_{10}$ hydrocarbon group, X, Y and Z are each independently a single bond or a divalent siloxane structure having the formula (6), with the proviso that at least one of X, Y and Z is a divalent siloxane structure having the formula (6),

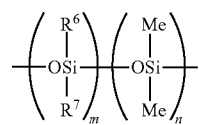

wherein $R^6$ and $R^7$ are each independently a substituted or unsubstituted monovalent $C_1$-$C_{10}$ hydrocarbon group, Me is methyl, m and n each are 0 or a positive number, m+n is an integer of at least 1.

5. The resist composition of claim 1 wherein the modified novolak resin is obtained from hydrosilylation reaction between an allyl-containing novolak resin comprising structural units having the formula (7):

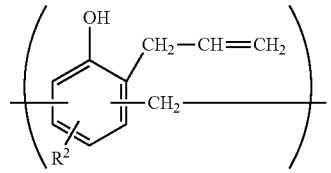

wherein $R^2$ is hydrogen or a substituted or unsubstituted $C_1$-$C_4$ alkyl group and an organosiloxane containing one hydrosilyl group in a molecule.

6. A positive resist composition comprising an organosiloxane-modified novolak resin comprising structural units having the formula (1):

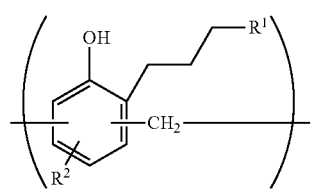

wherein $R^1$ is an organosiloxy group having a substituted or unsubstituted monovalent $C_1$-$C_{10}$ hydrocarbon group bonded to a silicon atom, and $R^2$ is hydrogen or a substituted or unsubstituted $C_1$-$C_4$ alkyl group, the hydrogen atom of some phenolic hydroxyl groups being replaced by a 1,2-naphthoquinonediazidesulfonyl group, and an organic solvent.

7. The resist composition of claim 6 wherein $R^1$ in formula (1) is an organosiloxy group having the formula (5):

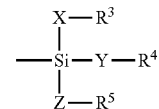

wherein $R^3$, $R^4$ and $R^5$ are each independently a substituted or unsubstituted monovalent $C_1$-$C_{10}$ hydrocarbon group, X, Y and Z are each independently a single bond or a divalent siloxane structure having the formula (6), with the proviso that at least one of X, Y and Z is a divalent siloxane structure having the formula (6),

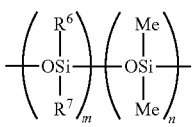

wherein $R^6$ and $R^7$ are each independently a substituted or unsubstituted monovalent $C_1$-$C_{10}$ hydrocarbon group, Me is methyl, m and n each are 0 or a positive number, m+n is an integer of at least 1.

8. The resist composition of claim 6 wherein the modified novolak resin is obtained from hydrosilylation reaction between an allyl-containing novolak resin comprising structural units having the formula (7):

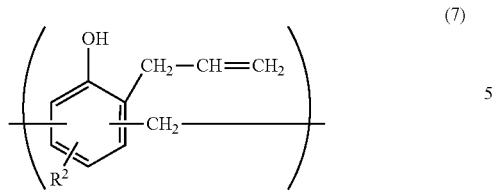

(7)

wherein $R^2$ is hydrogen or a substituted or unsubstituted $C_1$-$C_4$ alkyl group and an organosiloxane containing one hydrosilyl group in a molecule.

9. A pattern forming process comprising the steps of:
(i) coating the resist composition of claim 1 onto a substrate,
(ii) baking the composition to form a resist film,
(iii) exposing the film to UV radiation having a wavelength of up to 500 nm, and
(iv) optionally baking, and developing in an alkali developer.

10. A pattern forming process comprising the steps of:
(i) coating the resist composition of claim 6 onto a substrate,
(ii) baking the composition to form a resist film,
(iii) exposing the film to UV radiation having a wavelength of up to 500 nm, and
(iv) optionally baking, and developing in an alkali developer.

* * * * *